(12) United States Patent
Paltrier

(10) Patent No.: US 9,719,187 B2
(45) Date of Patent: Aug. 1, 2017

(54) METHOD FOR PRODUCING THE GROWTH OF A SEMICONDUCTOR MATERIAL

(71) Applicant: Societe Francaise de Detecteurs Infrarouges-Sofradir, Chatenay Malabry (FR)

(72) Inventor: Sylvain Paltrier, Voreppe (FR)

(73) Assignee: SOCIETE FRANCAISE DE DETECTEURS INFRAROUGES-SOFRADIR, Chatenay Malabry (FR)

( * ) Notice: Subject to any disclaimer, the term of this patent is extended or adjusted under 35 U.S.C. 154(b) by 467 days.

(21) Appl. No.: 14/465,875

(22) Filed: Aug. 22, 2014

(65) Prior Publication Data

US 2014/0360427 A1   Dec. 11, 2014

Related U.S. Application Data

(62) Division of application No. 11/972,111, filed on Jan. 10, 2008, now abandoned.

(30) Foreign Application Priority Data

Jan. 10, 2007 (FR) ...................................... 0752615

(51) Int. Cl.
*C30B 11/00* (2006.01)
*C30B 29/48* (2006.01)
(Continued)

(52) U.S. Cl.
CPC ............ *C30B 11/003* (2013.01); *C30B 11/00* (2013.01); *C30B 11/002* (2013.01); *C30B 11/14* (2013.01);
(Continued)

(58) Field of Classification Search
CPC ...... Y10S 117/911; C30B 15/24; C30B 11/00; C30B 29/48; C30B 15/22
See application file for complete search history.

(56) References Cited

U.S. PATENT DOCUMENTS 4,264,385 A * 4/1981 Fisher ..................... C30B 15/10
117/17
4,605,468 A * 8/1986 Pastor ..................... C30B 15/24
117/205
(Continued)

FOREIGN PATENT DOCUMENTS

EP      1114884      7/2001
EP      1460153      9/2004
(Continued)

*Primary Examiner* — Matthew Song
(74) *Attorney, Agent, or Firm* — Heslin Rothenberg Farley & Mesiti P.C.

(57) ABSTRACT

A method for producing the growth of a semiconductor material, in particular of type II-VI, uses a melt of the semiconductor placed in a sealed bulb under vacuum or under controlled atmosphere, the bulb being subjected to a sufficient temperature gradient for first maintaining the melt in the liquid state, then causing its progressive crystallization from the surface towards the bottom. The method further comprises an element capable of floating on the surface of the melt, and equipped with a substantially central bore, intended for receiving a seed crystal for permitting the nucleation leading to the preparation of a seed crystal, and also supporting the seed crystal above the melt while maintaining it in contact with the melt in order to permit the continued crystallization from the seed crystal by lowering the temperature gradient.

18 Claims, 1 Drawing Sheet

(51) Int. Cl.
*C30B 11/14* (2006.01)
*H01L 21/02* (2006.01)
*C30B 15/22* (2006.01)
*C30B 29/10* (2006.01)

(52) U.S. Cl.
CPC ........ *C30B 29/48* (2013.01); *H01L 21/02376* (2013.01); *H01L 21/02428* (2013.01); *H01L 21/02562* (2013.01); *H01L 21/02625* (2013.01); *H01L 21/02645* (2013.01); *C30B 15/22* (2013.01); *C30B 29/10* (2013.01); *Y10S 117/911* (2013.01); *Y10T 117/1024* (2015.01)

(56) References Cited

U.S. PATENT DOCUMENTS

| | | | | |
|---|---|---|---|---|
| 5,370,078 A | * | 12/1994 | Kou | ........................ C30B 15/24 117/208 |
| 2002/0098358 A1 | * | 7/2002 | Iino | ........................ C30B 15/36 428/402 |
| 2003/0089300 A1 | | 5/2003 | Hoshi et al. | |

FOREIGN PATENT DOCUMENTS

| | | |
|---|---|---|
| JP | 01294591 | 11/1989 |
| JP | 07291782 | 11/1995 |
| JP | 2006036550 | 2/2006 |

\* cited by examiner

METHOD FOR PRODUCING THE GROWTH OF A SEMICONDUCTOR MATERIAL

CROSS REFERENCE TO RELATED APPLICATIONS

This application is a divisional of U.S. patent application Ser. No. 11/972,111, filed Jan. 10, 2008, now abandoned, and claims priority of French Application No. 0752615 filed on Jan. 10, 2007, the entire disclosure of these applications being hereby incorporated herein by reference.

FIELD OF THE INVENTION

The invention relates to a device for producing the crystal growth of semiconductor compounds of type II-VI. It relates in particular to the growth of such ternary semiconductor materials having the general formula $Cd_xZn_{1-x}Te$, where x can have any value between zero and one.

The invention also has an application for the growth of compounds of this family incorporating selenium instead of tellurium, and even quaternary compounds having the formula $Cd_xZn_{1-x}Te_ySe_{1-y}$.

In general, the present invention applies to the preparation of such semiconductor materials produced in a sealed bulb, that is under vacuum or under controlled atmosphere.

The materials thereby obtained are more particularly intended to serve as epitaxial substrates for semiconductor compounds having the generic formula CdHgTe well known for the production of infrared detectors. The materials covered by the invention are also suitable for use for preparing X-ray or gamma ($\gamma$) ray detectors.

PRIOR ART

Demand for single crystal semiconductor materials having sufficiently large size is growing steadily. In fact, the preparation of such materials militates against their satisfactory economic production.

Among the difficulties encountered, mention can be made of the low thermal conductivity of these materials, which hinders the removal of the heat generated by crystallization, and gives rise to growth interface forms that are concave towards the liquid, which is unfavourable for single crystal formation.

Moreover, at the risk of drastically complicating the equipment, the presence among the components of volatile elements, in particular cadmium and selenium, implies carrying out the growth operations in sealed bulbs, mainly made from silica glass.

It is known how to produce the growth of crystalline materials from a melt made with the said material. This growth is conventionally carried out in a sealed bulb typically made from silica heated to the melting point of the melt in question. Various difficulties arise from the method for preparing such materials. Among these, in order to obtain a controlled crystallization of the material, a prerequisite for its subsequent functions, particularly as an efficient detector material, the synthesis of the single charged elements cadmium, tellurium, zinc and optionally selenium, must be complete, and only heating above the melting point of the compound, typically in a temperature range slightly over 1100° C. can guarantee this.

While this technology is simple to implement and effective, it is not suitable, at least conveniently, for producing the growth from an oriented single seed crystal, as is the case for conventional elemental semiconductors, such as silicon, or for compound semiconductors, such as gallium arsenide (AsGa). In fact, the superheat necessary for complete synthesis jeopardizes the safety of the seed crystal which is liable to melt.

Another difficulty encountered is the propensity of the melts of the materials in question to undergo supercooling, that is, the mechanism whereby a substance remains liquid at a temperature lower than its melting point. It is well known that when supercooling stops, that is on the interruption of the metastable equilibrium established therein, the subsequent solidification generally takes place suddenly and anarchically, culminating in the production of a low grade, small-grained polycrystal. The resulting solid may also have a relatively high weight, depending on the extent of the supercooling, which may reach a few tens of degrees C.

Thus, the supercooling mechanism alters the crystal yield and, above all, the crystallographic quality of the resulting solid, which is in any case inadequate for a large number of potential applications.

This problem associated with supercooling has been clearly identified for example in document EP-A-1 114 884.

The solution it recommends for overcoming this problem essentially resides in the deposition, on the bottom of the crucible receiving the melt, of a layer of solid material surmounted by the melt, and in very accurate and very strict control of the pressure and temperature conditions of the heating furnace in which the sealed bulb containing the said crucible is placed, the temperature gradient being kept lower than 10° C. per centimeter.

In other words, the conditions for producing the growth of the single crystal are particularly draconian and difficult to industrialize in practice.

In general, the prior art appears to show that the best results in terms of single crystal quality of the material to be produced are obtained when the crystallization is carried out from the surface of the melt towards the bottom thereof. Nucleation, that is the formation of the seed crystal constituting the core of the initial growth of the crystallographic structure to be obtained, therefore plays an essential role and must take place at the surface.

Thus, document JP 7291782 describes a method implementing this general principle. It describes the combination of a single seed crystal of CdTe floating on its growth melt, and initiating the crystallization from the upper surface of the melt. However, this technique presupposes that the solid CdTe seed crystal floats on its liquid. In fact, due to the very similar densities of the solid phase and the liquid phase of this material, this requirement can only be met by using a seed crystal having a diameter substantially equal to the diameter of the crucible, thereby raising two particular difficulties:

the first difficulty implies that such a sufficiently large diameter seed crystal is available;

the second difficulty is to avoid the complete fusion of the seed crystal during the heating steps prior to growth, if only to successfully liquefy the melt. In fact, a virtually total immersion of the seed crystal in the melt is observed due to the similarity of the respective densities of the liquid and the solid, so that to avoid total fusion of the seed crystal, the control of the thermal conditions is still crucial to prevent the fusion of the seed crystal, thereby altering the nucleation that it is supposed to engender.

Obviously, in such a case, direct synthesis with superheat from the component elements is out of the question, and must be carried out previously in another bulb, with all the attendant complications.

This is demonstrated by the difficulties faced by a person skilled in the art to successfully carry out a synthesis of semiconductor single crystals, particularly belonging to the II-VI family.

It is the object of the present invention to promote the genesis of such single crystals.

SUMMARY OF THE INVENTION

The invention proposes to implement the method of genesis of semiconductor single crystals carried out in a sealed bulb according to the methods described previously, but favouring the nucleation step by using a substance floating on the melt that is both chemically and thermally inert, in order to permit the growth of the solid while supporting the said solid as it grows on the surface of the melt.

In other words, the invention relates to a device for producing the growth of the semiconductor material from a melt of the said semiconductor placed in a sealed bulb under vacuum or under controlled atmosphere, the said bulb being subjected to a sufficient temperature gradient for first maintaining the melt in the liquid state, then causing its progressive crystallization from the surface towards the bottom.

The said device is characterized in that it further comprises an element capable of floating on the surface of the said melt, and equipped with a substantially central bore, intended on the one hand for receiving a seed crystal or for permitting the nucleation leading to the preparation of a seed crystal, and also of supporting the said seed crystal above the melt while maintaining it in contact with the said melt in order to permit the continued crystallization from the said seed crystal by lowering the temperature gradient.

In other words, due to the presence of the central bore, which is even co-axial with the axis of revolution of the crucible, the temperature is lowered at the said bore, causing the spontaneous solidification of a polycrystal seed crystal, thereby serving to promote the crystal growth of the said semiconductor throughout the mass of the melt.

According to an alternative of the invention, a growth seed crystal, hence solid, is previously positioned in the central bore, placed so that it is in contact with the melt but without allowing it to be completely or almost completely immersed, as it would naturally do under its own weight. The said seed crystal therefore, as in the preceding case, causes the crystal growth of the semiconductor throughout the mass of the melt.

According to the invention, the said floating element is made from a chemically and thermally inert refractory material, selected from the group comprising silica, alumina, silicon carbide, aluminium nitride and carbon in all its forms, but preferably in graphite form.

Advantageously, the said element substantially occupies the whole upper surface of the melt, with the exception of the central bore, in order to minimize the effects of the heat radiation inherent in the temperature of the melt, thereby serving to avoid the fusion of the solid being formed.

BRIEF DESCRIPTION OF THE DRAWINGS

The manner in which the invention can be implemented and the advantages thereof, will appear better from the exemplary embodiments that follow, provided for information and non-limiting, in conjunction with the appended figures.

DETAILED DESCRIPTION OF THE INVENTION

Figure 1:
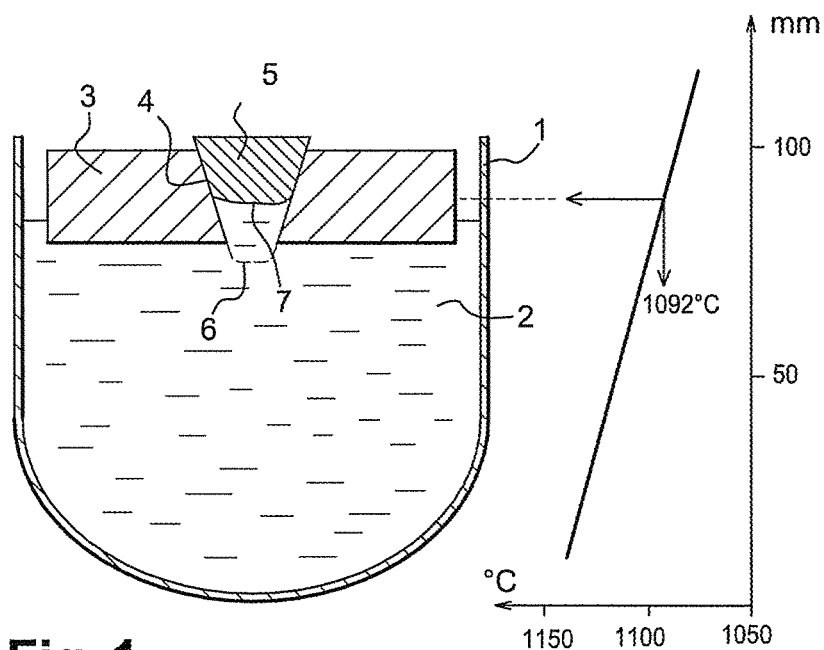
FIG. 1 is a schematic representation of the principle of the invention according to a first embodiment of the invention using a seed crystal.

A first embodiment of the invention is described in relation to FIG. 1.

In a manner known per se, it uses a crucible (1) made from a refractory material and typically from silica.

The diameter of the said crucible is 90 mm for example. The said crucible may be placed in a sealed bulb not shown, or the said bulb may itself act as the crucible. It is positioned in a heating furnace, in order to subject the bulb to a thermal gradient such as shown in the right hand part of the said FIG. 1.

A charge of CdTe is placed in the said crucible (1), the said charge, when placed in the furnace, and due to the thermal gradient imposed thereby, is in the liquid state, and therefore at a temperature in the present case above 1092° C., the melting point of the compound CdTe.

According to one feature of the invention, a graphite cylinder (3) having a diameter close to 88 mm, that is, very close to the inside diameter of the crucible (1), is positioned on the upper surface of the melt thus prepared.

In the example described, the said graphite cylinder has a thickness of 15 mm. It is provided with a frustoconical bore (4), whereof the small base is directed downwards and therefore terminates in the melt, and the large base is directed upwards, as may be observed in FIG. 1.

Owing to the density of the graphite, which has a specific gravity close to 2.2, the graphite flows without difficulty on the surface of the CdTe melt, whereof the specific gravity is between 5 and 6. Furthermore, carbon in all its forms is well known for its chemical inertness, its refractory properties, its thermal inertia, and also has the advantage over other materials, such as for example silica, alumina, aluminium nitride or silicon carbide, of being easily machinable, thereby favouring the preparation of the frustoconical bore (4).

According to one feature of the invention, a single seed crystal (5) of CdTe is positioned in the truncated cone thus defined, having sufficient dimensions to be retained by the walls of the bore, and yet allowing it to be flushed with and even in contact with the upper surface of the melt (2).

It should be clear that the core of the invention resides in the maintenance of the seed crystal according to the preceding characteristics, and by all possible means, the truncated cone merely constituting one convenient embodiment.

The initial shape of the seed crystal (5) has accordingly been shown by a dotted line, that is prior to the melting of the charge. Under the action of the melt temperature, the seed crystal is partially melted, until a new solid/liquid interface is defined, positioned at the fusion/solidification isotherm of the compound CdTe, and typically 1092° C.

It is therefore clear that a main part of the seed crystal (5) is maintained outside the melt, that is, in a zone where the temperature is lower than the melting point, thereby favouring the single crystal growth of the semiconductor material to be obtained, by varying the temperature gradient as the material solidifies downwards, and more precisely, by generally lowering the temperature of the gradient as the material solidifies.

The implementation of this method for producing the single crystal material is carried out without laborious temperature adjustments owing primarily to the use of the graphite cylinder (3) and the conformation of its bore (4), contrary to the prior art, in which the seed crystal floats freely on the melt, the emergent part of the solid being extremely slight due to the very small difference in the solid/liquid densities, the float (3) thereby serving to avoid the complete fusion of the seed crystal.

According to another advantageous feature of the invention, owing to the dimensions of the cylinder, that is substantially those of the crucible in terms of diameter, radiation is limited and hence the corollary heat transfers from the melt (2), liable to induce a temperature close to the melting point above the said melt, and hence the fusion of the seed crystal.

Furthermore, the use of graphite, known for its easy machinability, serves to modify the mechanisms of heat transfers chiefly by conduction, and thereby to adjust the shape and convexity of the solid/liquid interface. Use can be made in particular of pyrolytic graphite, better known as "pyrocarbon" from Le Carbone Lorraine, because of its pronounced thermal anisotropy, suitable for establishing very different heat transfers radially and axially, and thereby promoting single crystal growth.

While the cylinder (3) has been described using a single material, the use of a composite floating support can be considered, for example consisting partly of dense graphite and partly of sheet graphite.

Such a composite material is known by the trade name "Papyex", also from Le Carbone Lorraine.

Similarly, use can be made of graphite, coated after machining and particularly after the preparation of the bore, with silicon carbide or with a thin deposit of pyrocarbon, suitable for modifying the wettability of the melt (surface tension) with regard to the float according to the invention, and here also, for optimizing the growth interface at the start of the process.

This demonstrates the advantage of this first embodiment, which serves to start with a small seed crystal, hence easier to prepare, and above all, to eliminate the problem of supercooling, because by starting with a seed crystal already formed, then kept above the melt, the said supercooling can no longer take place.

Figure 2:
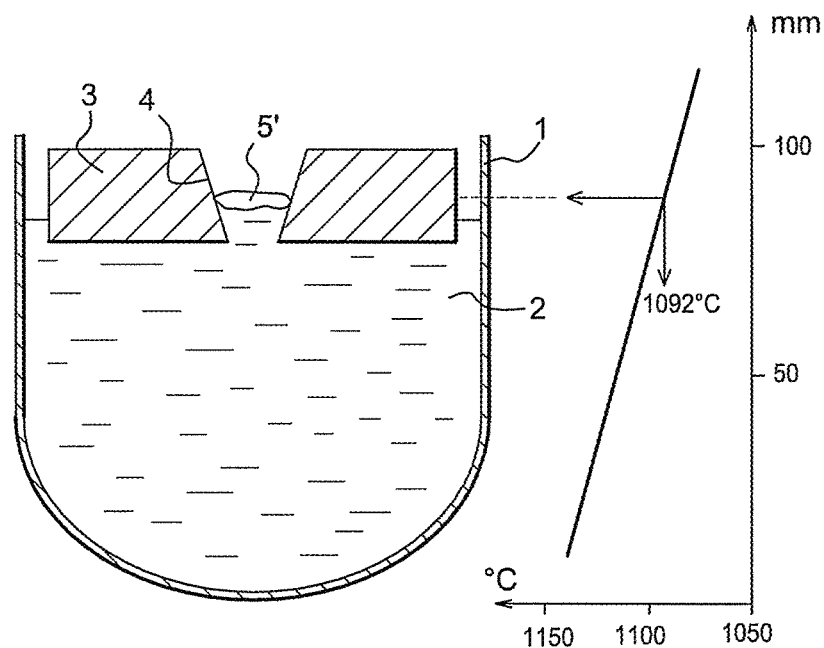
FIG. 2 is a similar view to FIG. 1, showing the spontaneous solidification of a polycrystalline seed crystal suitable for initializing growth.

According to another embodiment in relation to FIG. 2, the principle employed remains identical, but with the exception that the seed crystal initiating the nucleation is not joined to the cylinder, but created in situ by lowering the temperature according to a thermal gradient capable of causing the early crystallization of the melt surface.

More precisely, after superheating the crucible by about ten ° C. for example, above the melting point of the semiconductor concerned, the temperature of the charge is lowered at a gradient such as to cause the crystallization of the melt surface.

Due to the presence of the floating body of the type previously described, the first solidified fraction is preferably generated and then maintained at the centre of the melt in the bore prepared in the floating body. A seed crystal is accordingly created, then acting as the initiator of the crystallization that follows, obtained by lowering the temperature of the overall crucible (1) at a predefined thermal gradient, similar to the one used in the first embodiment described, with natural selection of the favourable crystallization directions and production of a coarse grained, or even single crystal ingot.

This clearly demonstrates the advantage of the device of the invention, whether concerning one alternative or another, insofar as it serves to promote the crystallization in privileged directions of a semiconductor material without requiring the precise and arduous control of the entire thermal aspect of the method implemented, and serving as required, to cause a superheating of the crucible chamber above the melting point of the melt, whenever this may be deemed necessary by the operator.

In this second case, it is no longer necessary to have a previously prepared synthetic charge to be melted to create the melt of semiconductor material, because it is then possible to carry out this synthesis directly in situ using the component elements of the compound.

The invention claimed is:

1. A method for growing a semiconductor material of type II-VI, comprising:
   placing a melt of the semiconductor material in a bulb;
   floating a support element having a through bore on the melt;
   directly supporting a seed crystal in said bore, by an internal face of said bore, above the melt while maintaining the seed crystal in contact with the melt;
   sealing the bulb under vacuum or under controlled atmosphere;
   subjecting the sealed bulb to a temperature gradient for first maintaining the melt in a liquid state and then causing progressive crystallization of the melt from a top surface of the melt towards a bottom of the melt;
   producing continuous crystallization of the melt from the seed crystal by lowering the temperature gradient; and
   maintaining the seed crystal in direct contact with the internal face of the bore throughout the continuous crystallization.

2. The method for growing a semiconductor material according to claim 1, wherein the bore of the support element has a frustoconical shape, and a small base of the bore is directed downwards and terminates in the melt, and a large base of the bore is directed upwards when the support elements floats on the melt.

3. The method of claim 2, further comprising positioning a single seed crystal of the semiconductor material in the bore, the single seed crystal being dimensioned to be retained by the internal face of the bore while also being flushed with or in contact with the top surface of the melt; and partially melting the single seed crystal, under action of melt temperature, until a new solid/liquid interface is defined, positioned at a fusion/solidification isotherm of the semiconductor material.

4. The method of claim 3, wherein the semiconductor material comprises CdTe, and said isotherm comprises 1092° C.

5. The method for growing a semiconductor material according to claim 1, wherein said seed crystal directly supported by the bore so that the seed crystal is in contact with the melt but without allowing the seed crystal to be completely or almost completely immersed in the melt.

6. The method for growing a semiconductor material according to claim 1, further comprising producing the support element from a chemically and thermally inert refractory material selected from the group comprising silica, alumina, silicon carbide, aluminum nitride and carbon in all forms.

7. The method for growing a semiconductor material according to claim 6, wherein the support element is made from graphite.

8. The method for growing a semiconductor material according to claim 7, wherein the support element is made from pyrolytic graphite.

9. The method for growing a semiconductor material according to claim 7, wherein the support element is made partly from dense graphite and partly from sheet graphite.

10. The method for growing a semiconductor material according to claim 7, further comprising coating at least a portion of the support element after preparing the bore, with silicon carbide or with a thin deposit of pyrolytic carbon.

11. The method for growing a semiconductor material according to claim 1, further comprising sizing the support element to substantially occupy the whole top surface of the melt, with the exception of the bore, in order to minimize effects of heat radiation from the melt.

12. The method of claim 1, further comprising:
nucleating the seed crystal within the bore.

13. The method of claim 12, wherein said nucleating comprises creating the seed crystal within the bore by lowering temperature of the melt to cause early crystallization of the top surface of the melt.

14. The method of claim 13, wherein said nucleating comprises superheating the melt above a melting temperature of the semiconductor material, and then lowering the temperature to cause the early crystallization.

15. The method of claim 1, wherein said maintaining comprises maintaining the seed crystal in contact with the melt without allowing the seed crystal to be completely immersed or almost completely immersed in the melt.

16. The method of claim 1, wherein said maintaining comprises maintaining a main part of the seed crystal outside the melt.

17. The method of claim 16, wherein said maintaining avoids complete fusion of the seed crystal, and produces single crystal growth of the semiconductor material.

18. The method of claim 1, wherein the semiconductor material has at least one of the following general formulas: $Cd_xZn_{1-x}Te$, $Cd_xZn_{1-x}Te_ySe_{1-y}$, and CdHgTe, where x and y can have any value between zero and one.

* * * * *